United States Patent
Lim et al.

(10) Patent No.: US 9,198,278 B2
(45) Date of Patent: Nov. 24, 2015

(54) APPARATUS AND METHOD OF MINIATURIZING THE SIZE OF A PRINTED CIRCUIT BOARD

(71) Applicant: MOTOROLA SOLUTIONS, INC, Schaumburg, IL (US)

(72) Inventors: Khai Loke Lim, Penang (MY); Kow Chee Chong, Kedah (MY); Macwien Krishnamurthi, Shah Alam (MY); Swee Theam Thor, Sungai Ara (MY)

(73) Assignee: Motorola Solutions, Inc., Schaumburg, IL (US)

( * ) Notice: Subject to any disclaimer, the term of this patent is extended or adjusted under 35 U.S.C. 154(b) by 26 days.

(21) Appl. No.: 14/188,998

(22) Filed: Feb. 25, 2014

(65) Prior Publication Data

US 2015/0245467 A1 Aug. 27, 2015

(51) Int. Cl.
| | | |
|---|---|---|
| H01L 23/48 | (2006.01) | |
| H05K 1/02 | (2006.01) | |
| H05K 1/03 | (2006.01) | |
| H05K 1/09 | (2006.01) | |
| H05K 1/11 | (2006.01) | |
| H05K 3/42 | (2006.01) | |
| H05K 3/00 | (2006.01) | |
| H01L 21/44 | (2006.01) | |

(52) U.S. Cl.
CPC ............ *H05K 1/0218* (2013.01); *H05K 1/0366* (2013.01); *H05K 1/09* (2013.01); *H05K 1/115* (2013.01); *H05K 3/0017* (2013.01); *H05K 3/427* (2013.01); *H05K 2201/09545* (2013.01); *H05K 2203/063* (2013.01); *H05K 2203/0703* (2013.01)

(58) Field of Classification Search
CPC .............................. H05K 1/0218; H05K 1/09
USPC ........................................... 438/667; 257/774
See application file for complete search history.

(56) References Cited

U.S. PATENT DOCUMENTS

| | | | | |
|---|---|---|---|---|
| 4,814,855 | A | * | 3/1989 | Hodgson ................. H01L 24/10 174/255 |
| 5,530,288 | A | * | 6/1996 | Stone ................ H01L 23/49838 257/686 |
| 6,323,439 | B1 | * | 11/2001 | Kambe ................ H05K 3/0038 174/255 |
| 7,980,863 | B1 | | 7/2011 | Holec et al. |
| 8,437,260 | B2 | | 5/2013 | Kim et al. |
| 2008/0168651 | A1 | | 7/2008 | Bhatt et al. |
| 2009/0223710 | A1 | | 9/2009 | Becker et al. |
| 2012/0008294 | A1 | | 1/2012 | Minoo et al. |

OTHER PUBLICATIONS

Austria Technologhie & Systemechnik (AT&S)—2.5DP Pipe—Lateral non-electrical connection—www.ats.net.

* cited by examiner

*Primary Examiner* — Long K Tran
(74) *Attorney, Agent, or Firm* — Barbara R. Doutre

(57) ABSTRACT

A printed circuit board includes at least one plated-through hole via drilled into at least one of a first layer on a first side of the printed circuit board and a second layer on a second side of the printed circuit board. The printed circuit board also includes a core section laminated between the first layer and the second layer, wherein a length of the core section is shorter than a length of the first layer and a length of the second layer. The printed circuit board further includes an open slot configured to house a connection tab of an electronic product connected to the printed circuit board, wherein the open slot is formed adjacent to the core section and between sections of the first layer and the second layer that are longer than the core section.

15 Claims, 12 Drawing Sheets

APPARATUS AND METHOD OF MINIATURIZING THE SIZE OF A PRINTED CIRCUIT BOARD

BACKGROUND OF THE INVENTION

One avenue for minimizing the size and enhancing protection, quality and reliability of an electronic product is to reduce the substrate outline of a printed circuit board (PCB) and increase the design robustness, margins and interconnect schemes integrity of the electronic product. Radio batteries used in the portable radio communications field often require numerous components to support charging and radio interface operations. Therefore, a reduced PCB in a radio battery with enhanced protection, quality and reliability, for example, must still be capable of housing all required circuitry for the radio battery. Consider an example where in a battery product used in portable radios approximately 80 components need to be housed on the PCB, including 4 connection tabs for connections with a battery charger contacts, 3 connection tabs for connections with a radio contacts, and 3 connection tabs for connections with a battery cell contacts, assuming a 2 Li ion cells in series, 1 cell in parallel cell pack configuration. In order to connect the PCB with all of the required contacts, the connection tabs on the PCB are typically spot welded to the appropriate contacts using spot welding or resistance welding. When the tabs are spot welded to the contacts, 1 connection tab typically requires a space of 84 mm$^2$ on one side (referred to as a first side) of the PCB.

In addition, to the space required on the first side of the PCB for each connection tab, an area on the opposite side of the PCB needs to be reserved (this area is also referred to herein as a keep-out area) to support the spot welding, ensure the rigidity, and maintain a best practice pull/peel force of 6 lb minimum for the weld. The reserved space in totality also accounts for errors associated with placement and reflow of the surface base tabs as well as the misalignment and overhanging of tabs by human and/or machinery including, for example, alignment fixtures, tools and Surface Mount Technology (SMT) reflow ovens. Therefore, for a battery product with 10 connection tabs, a space of 840 mm$^2$ must be reserved on the first side of the PCB to allow for the clearances to counter and cater for the aforementioned drawbacks. If a reduced PCB in the battery product provides 1496 mm$^2$ on one side, then the tabs will use up 56% of the available space on the first side. While the remaining space on the first side of the PCB may be reserved for test point and traces, the space on the opposite side of the reduced PCB is not large enough to house the remaining 70 components of the battery product. In order to fit all the components and route all the traces on the PCB, the battery product may require a 4-6 layer board. However, using a multilayer PCB increases the cost of the product. Moreover, real estate for components placement would be still wanting, thus it would be eminent to increase the PCB size dimensions.

Accordingly, there is a need for an apparatus and method for miniaturizing the size of a printed circuit board while still accommodating the product components, coupled with improvements with regards to protection due to fault modes, quality, and reliability.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
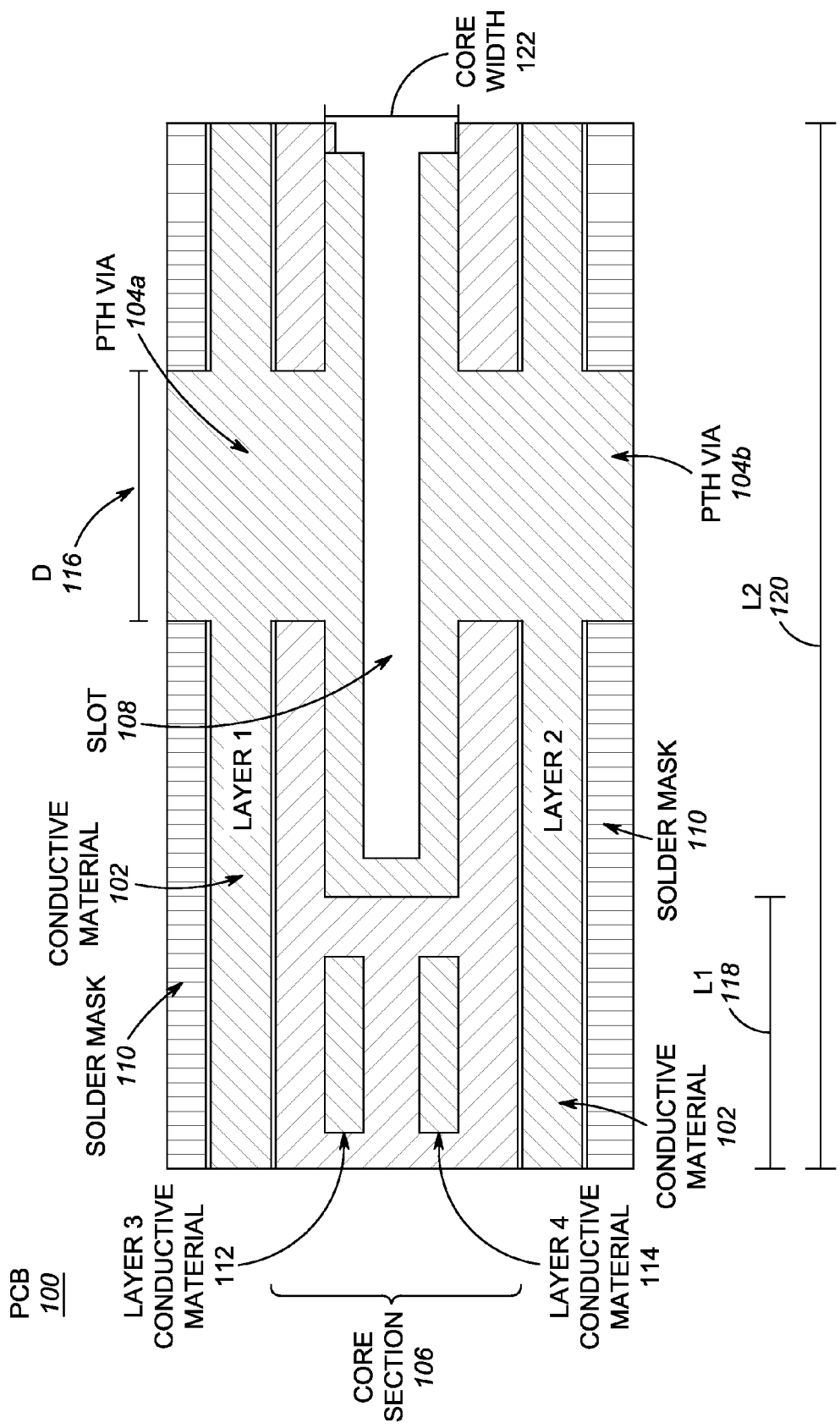
FIG. 1 is a block diagram of a printed circuit board (PCB) formed in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Some embodiments are directed to methods and apparatuses for creating a printed circuit board. The printed circuit board includes at least one plated-through hole via drilled into at least one of a first layer on a first side of the printed circuit board and a second layer on a second side of the printed circuit board. The printed circuit board also includes a core section laminated between the first layer and the second layer, wherein a length of the core section is shorter than a length of the first layer and a length of the second layer. The printed circuit board further includes an open slot configured to house a connection tab, interface connectors, physical switches (for example, for controlling ON/OFF states, volume, and/or channel), and/or a metal structure of an electronic product connected to the printed circuit board, wherein the open slot is formed adjacent to the core section and between sections of the first layer and the second layer that are longer than the core section.

FIG. 1 is a block diagram of a printed circuit board (PCB) formed in accordance with some embodiments. A conductive material 102, for example, copper is dipped into a plating liquid and plated with PCB 100 to create a first layer with conductive plating (also referred to as layer 1) on one side (also referred to as the first side or top side) of PCB 100. Conductive material 102 is also plated to a core section 106 of PCB 100, forming layer 3 conductive material 112 and layer 4 conductive material 114 in the core section 106. In an embodiment, layer 1, as referred to herein, includes the section labeled as layer 1 and core section 106. Hence, in an embodiment, layer 1 may be a composite of a pre-laminated two layer board. One or more plated-through hole (PTH) via, for example, PTH via 104a, may be drilled into specific locations of the first layer (i.e., layer 1) and core section 106. If needed, one or more PTH via, for example, PTH via 104b, may be drilled into specific locations on a second layer (also referred to as layer 2) created on the opposing side (also referred to as the second or bottom side) of PCB 100 and through core section 106. The second layer is also created by plating a conductive material 102 with PCB 100. The PTH via may be drilled in any location on the first layer and/or second layer of the PCB, not necessarily in directly opposing sides, as long as it facilitates easy placements and planning of components from electrical noise rejection (for example, Electromagnetic Compatibility (EMC) and Electromagnetic Interference (EMI)), design for assembly (DFA) and/or enhanced pull/peel force strength of user interface connectors and control components.

In an embodiment, layer 2, as referred to herein, includes the section labeled as layer 2 and core section 106. Hence, in an embodiment layer 2 may also be a composite of a pre-laminated two layer board. The diameter (D) 116 of PTH via 104 (i.e., PTH via 104a and PTH via 104b) may be 3.0 mm, for example. The diameter 116 of PTH via 104 is selected according to the viscosity/flow of the plating material. In some embodiments, PCB 100 may include two layers (layer 1 and layer 2 on the top and bottom sections of the PCB) with PTH via (for example, PTH 104a and PTH 104b) or PCB 100 may include only one layer (layer 1 or layer 2 on the top or bottom sections of the PCB) with the PTH via (for example, PTH via 104a). A solder mask 110 may be applied on the top layer and/or the bottom layer of PCB 100.

The layers (i.e., layer 1 and layer 2) with PTH via 104 may be laminated to core section 106. The length (L1) 118 of core section 106 may be shorter than a length (L2) 120 of a top section and a bottom section in each of layer 1 and layer 2, forming an open/empty slot or cutout 108 between the top section and the bottom section of each of layer 1 and layer 2 on PCB 100. Slot 108 is adjacent to the core section 106. In an embodiment, the top and bottom sections of each of layer 1 and layer 2 may be of equal lengths.

In an embodiment, core section 106 may be a "no-flow" prepeg material. An example of a "no-flow" pre-peg material may include a fiber reinforced polymer (FRP) pre-impregnated with a resin, for example, epoxy resin or other resins. The "no-flow" prepeg material may be used to form the thickness, for example, of a core width 122 of a 1.00 mm gap in between the layers of PCB 100.

In order to connect PCB 100 to, for example, a metal tab, a contact, a ground finger, EMI absorbers or structures, or other interconnect elements (all of which are referred to herein as connection tabs/stubs/leads or simply as connection tabs) of, for example, a housing, cover, cell pack, or the transceiver assemblies of an electronic component, each connection tab of the electronic component is inserted into a slot 108 on PCB 100, thereby affixing PCB 100 to the interface components of the electronic component or vice-versa. In other word, when connection tabs of the electronic component is inserted into slot 108 on PCB 100, PCB 100 is affixed to the inserted connection tabs and other items like contact fingers and interconnect connectors. For example, in the case of a battery-to-charger connection interface where four connection tabs are required for connecting a battery product with a battery charger contact, the four charger connection tabs are inserted into four slots 108 on PCB 100. The "no-flow" prepeg may be used to limit the depth of the connection tabs insertions, connector leads/stubs/tabs/contacts and ensure uniformity and controlled assembly of the respective components of the battery product. The connection tab/leads/stubs/contacts may also be host-battery interface connection blocks which function provides a contact grounding finger. Such a contact block coupled with a ground finger attached in the area of the aforementioned specific location, would enable efficient/immediate grounding between PCB 100, that encompasses for example, the host transceiver PCB assemblies and/or sub-assemblies and a host chassis, which would then suppress and/or reject low and frequency noise/spurious signals that would otherwise affect the Radio Frequency (RF) transceiver-battery-charger parametric performances at transceiver/radio level and/or system level The connection tab may be a tab, wire or other conductive element (for example, leads, stubs, and interconnect structures such as pogo pins and bifurcated prongs). The geometries of the PCB internal structure for the PTH via may be adjusted based on the geometries of the connection tabs.

Figure 2A:
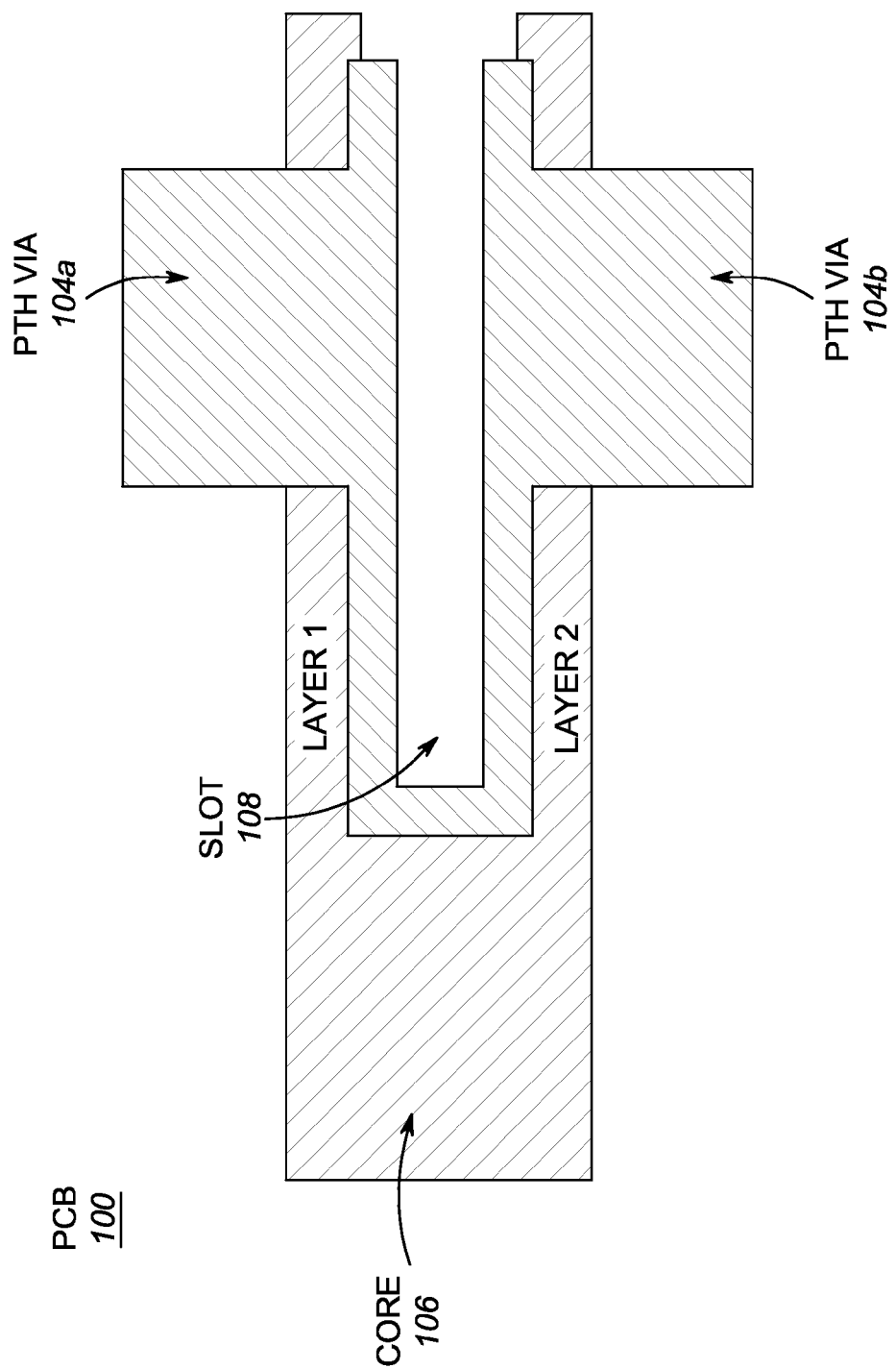
FIGS. 2A-2D are further diagrams that illustrate how the PCB is formed in accordance with some embodiments.
Figure 2B:
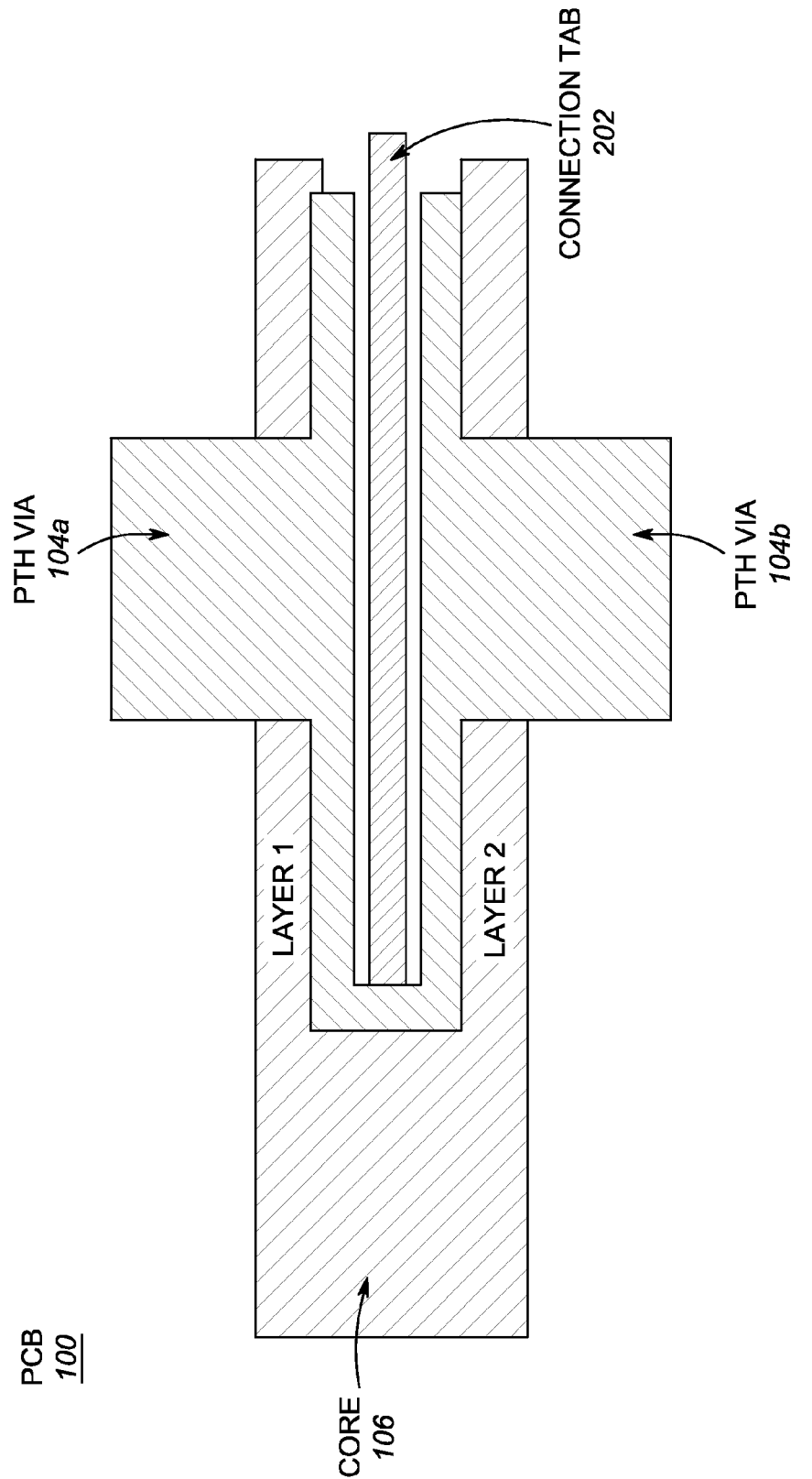

FIGS. 2A-2D are further diagrams that illustrate how the PCB is formed in accordance with some embodiments. FIG. 2A shows slot 108 created during PCB fabrication such that PCB 100 is ready for insertion of a connection tab. FIG. 2B shows a connection tab 202 inserted into slot 108 to connect PCB 100 to, for example, a housing, cover, cell pack, or the transceiver assemblies of an electronic component.

Figure 2C:
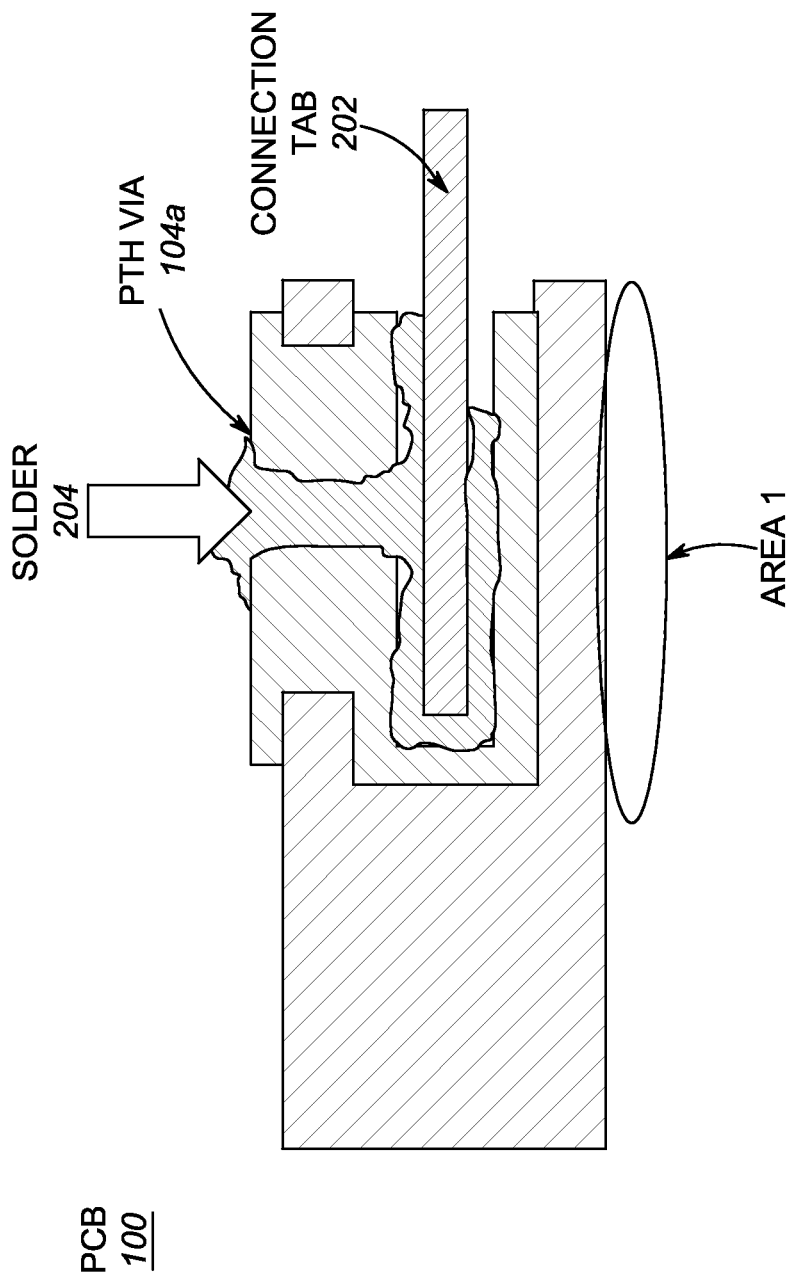

FIG. 2C shows melted solder 204 being applied through one PTH via 104a into the remaining section of slot 108 to create a solder joint and secure the connection tab 202 with PCB 100. The area in the circle, i.e., the area under PTH via 104a denoted as area 1, remains available for housing components on PCB 100. Note that FIG. 2C shows an example where a PTH via is drilled into a location on only the top layer (i.e., layer 1) and core section 106.

Figure 2D:
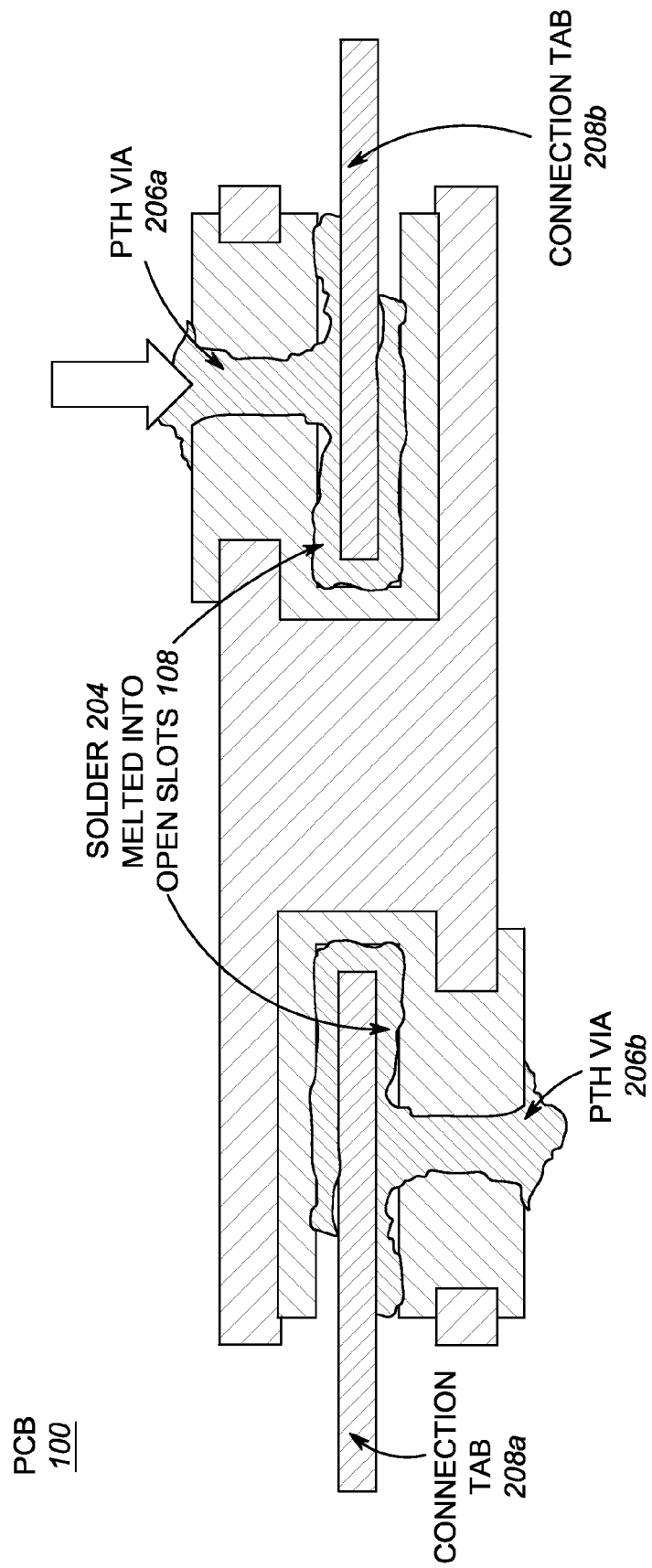

FIG. 2D shows melted solder 204 being applied through two PTH via 206 (one PTH via, i.e., PTH via 206a, drilled into a location on the top layer and core section of the PCB and the other PTH via, i.e., PTH via 206b, drilled into a location on the opposing layer and core section of the PCB) and into the remaining section of slots 108 to create solder joints and secure the connection tabs 208a and 208b with PCB 100. The melted solder may be applied through PTH via 206a and 206b at the same time i.e., simultaneously, or at different times. As noted previously, when a PCB is connected to an electronic product by spot welding tabs on the PCB to contacts on the electronic component, each connection tab on the PCB typically requires a space of 84 mm$^2$ on one side of the PCB and reserved space on the opposite side of the PCB to support and ensure the rigidity of the weld. In an embodiment, the diameter of slot 108 may be, for example, 6 mm, i.e., much less than the past 84 mm$^2$ required for spot welding tabs to the PCB, thus reducing the space on PCB 100 required for connections.

By reducing the space on PCB 100 from the past 84 mm$^2$ required for spot welding tabs to the PCB to, for example, a 6 mm diameter for slot 108, at least 300 mm$^2$ on PCB 100 may be used to house and/or populate product components on PCB 100 rather than for connecting PCB 100 to connection tabs and being reserved for the respective spot welding tab clearances that account for errors associated with surface mount placement of tab misalignment, tab interconnecting tolerances for tab over hanging and spot welding support fixture tolerances. In addition, the space required on the opposite side of the PCB during spot welding need not be reserved for the solder points and can be further used to house/populate product components on PCB 100. In this example, an additional 588 mm$^2$ on the opposite side of the solder points may be used to house product components on PCB 100. Eliminating or reducing spot welding tabs, its associated pick, place and reflow process, also reduces the cost of PCB 100. Eliminating or reducing spot welding tabs also results in savings of time in setting up the weld machine and the process involved in getting two good (best practice minimum 61*b* force) weld nuggets for each tab that is welded to the PCB. Accordingly, an embodiment of PCB 100 eliminates all spot welding nugget related issues associated with obtaining two good weld nuggets for each tab welded to the PCB and significantly improves impedance reduction, since the method of resistance welding and laser welding, produces the added impedances of: i) only a two nugget connection between the spot welded upper tab and the surface mount tab ii) the impedance of the surface mount tab in itself; and iii) the PCB board layout constraints in order to facilitate the surface mount tabs reflow. An embodiment of PCB 100 also eliminates any consideration of a peel force for the spot welding process and results in more robust and reliable interface joints compared with spot welds.

Figure 3:
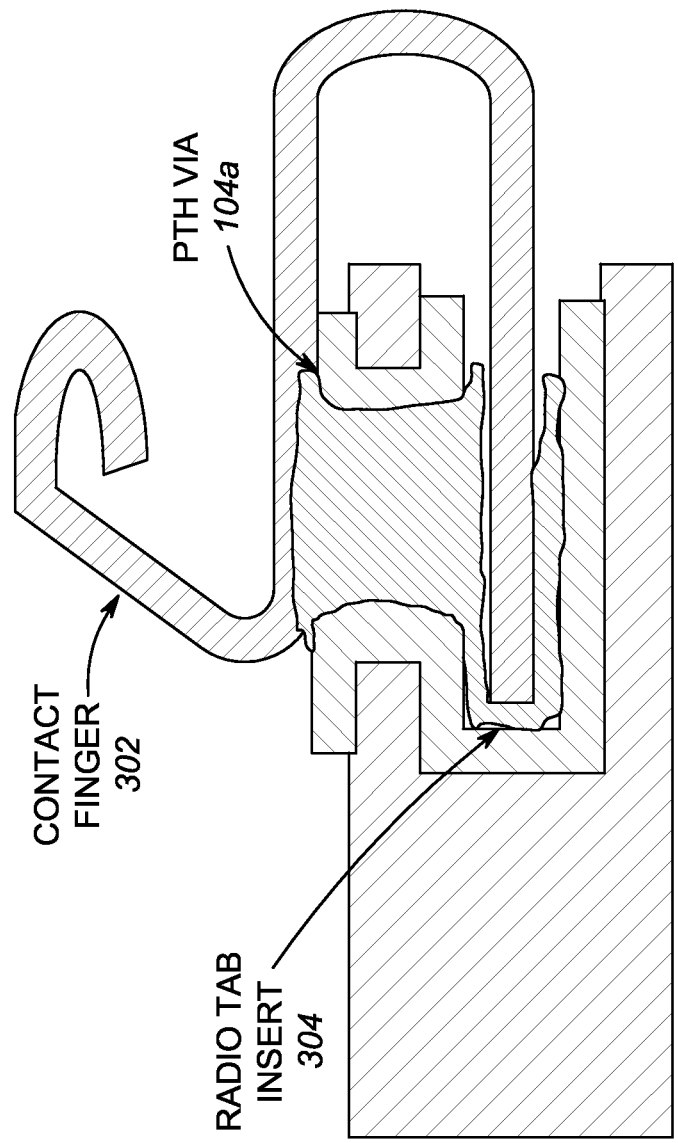
FIG. 3 is a block diagram of another embodiment of the PCB formed in accordance with some embodiments.

FIG. 3 is a block diagram of another embodiment of the PCB formed in accordance with some embodiments. In radio transceiver boards and mechanical assembly and construction, the radio negative contact block clip makes the ground route via a screw and screw bosses and then to a chassis for the radio or from the negative contact block clip to a transceiver board outer periphery and then to the chassis. In FIG. 3, a ground contact finger 302 may be fixed directly below the radio contact block assembly and within PCB 100 via a radio tabs insert 304, thereby facilitating direct and "immediate" ground from the radio negative contact clip to the radio chassis. By using a direct interconnect at the radio contact assembly negative pin to the chassis to provide a path of immediate and substantial ground, several radio-battery RF and EMC systemic issues may be resolved.

Therefore, embodiments of PCB 100 also provide opens opportunities for system grounding and noise cancellation enhancements (for example, finger attachments, shielding structures, or insertion of EMI absorbers). Alignment jig for the welding process can be eliminated. In addition, the PCB edge may be used to insert radio tabs for an appropriate contact system.

Figure 4:
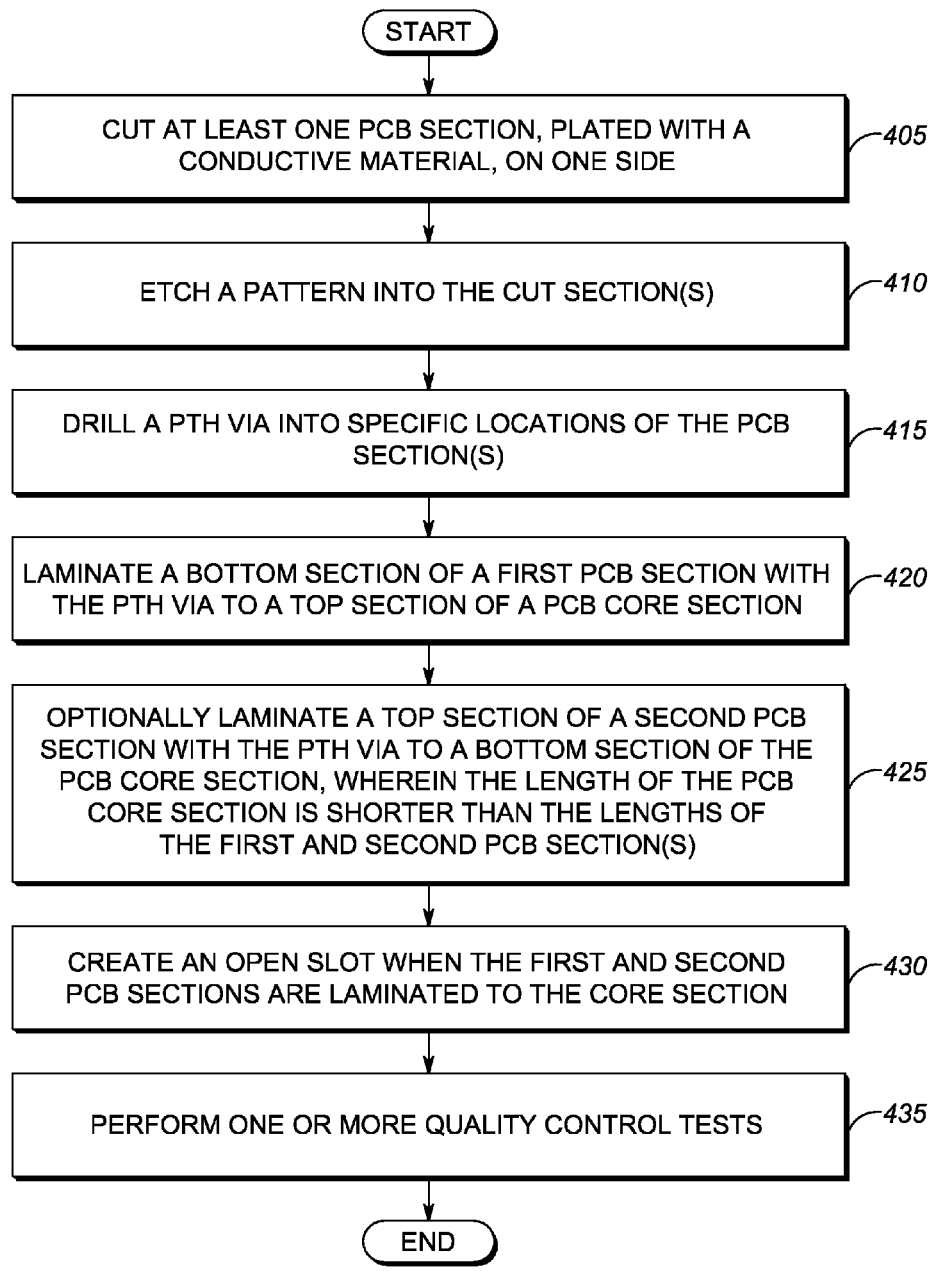
FIG. 4 is a flow diagram of steps implemented during manufacturing of the PCB in accordance with some embodiments.

FIG. 4 is a flow diagram of steps implemented during manufacturing of the PCB in accordance with some embodiments. At 405, cut at least one PCB section, plated with a conductive material, on one side. At 410, etch a pattern into the cut section(s). At 415, drill a PTH via into predetermined specific locations of the PCB section(s). At 420, laminate with, for example, the prepeg, a bottom section of a first PCB section with the PTH via to a top section of a PCB core section. At 425, optionally laminate with, for example, the prepeg, a top section of a second PCB section with the PTH via to a bottom section of the core PCB section, wherein the length of the PCB core section is shorter than the lengths of the first and second PCB sections(s). At 430, create an open slot when the first and second PCB sections are laminated to the core section. At 435, perform one or more quality control tests.

Figure 5A:
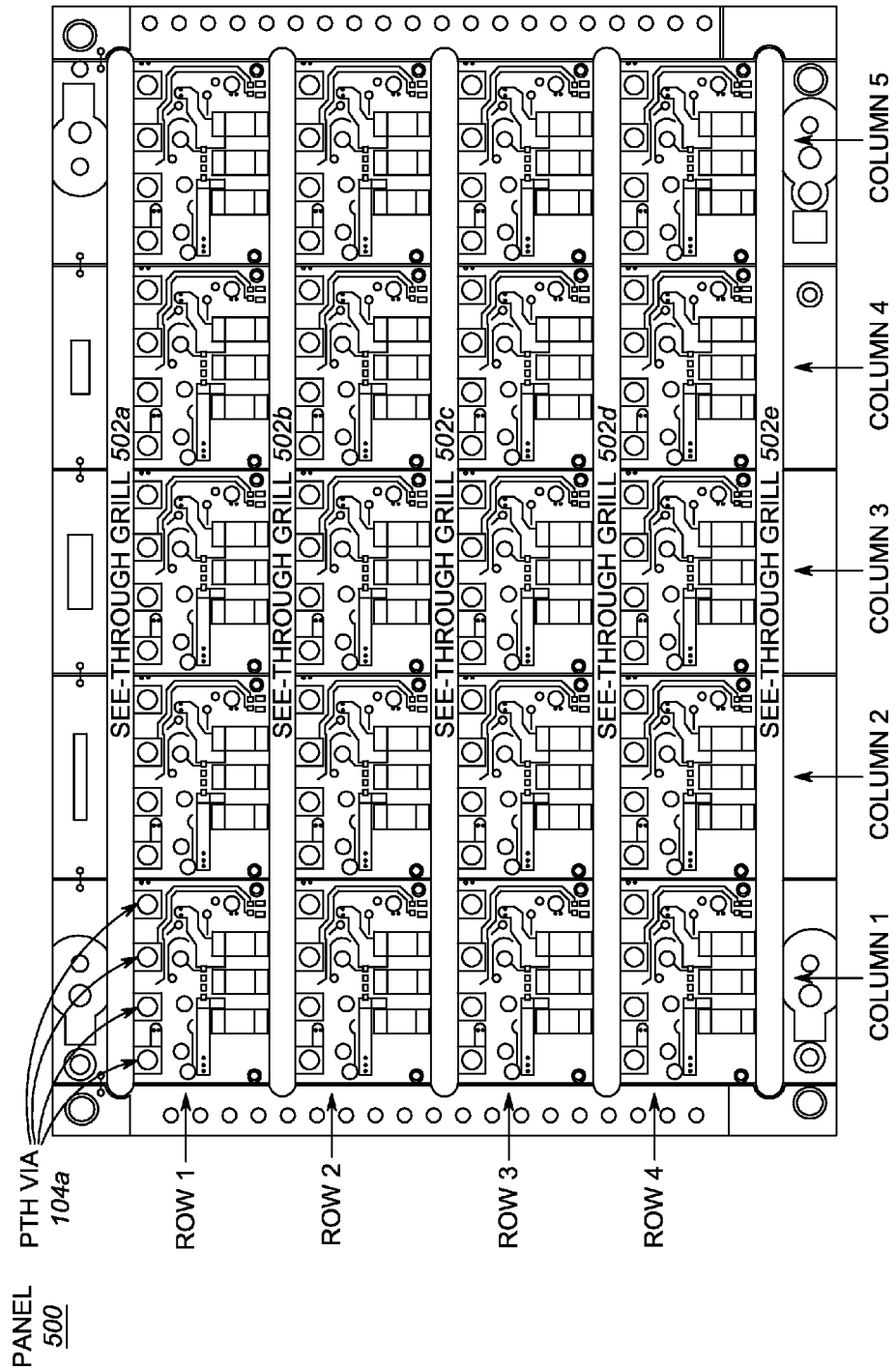
FIGS. 5A and 5B show top views of a PCB panel formed in accordance with some embodiments.
Figure 5B:
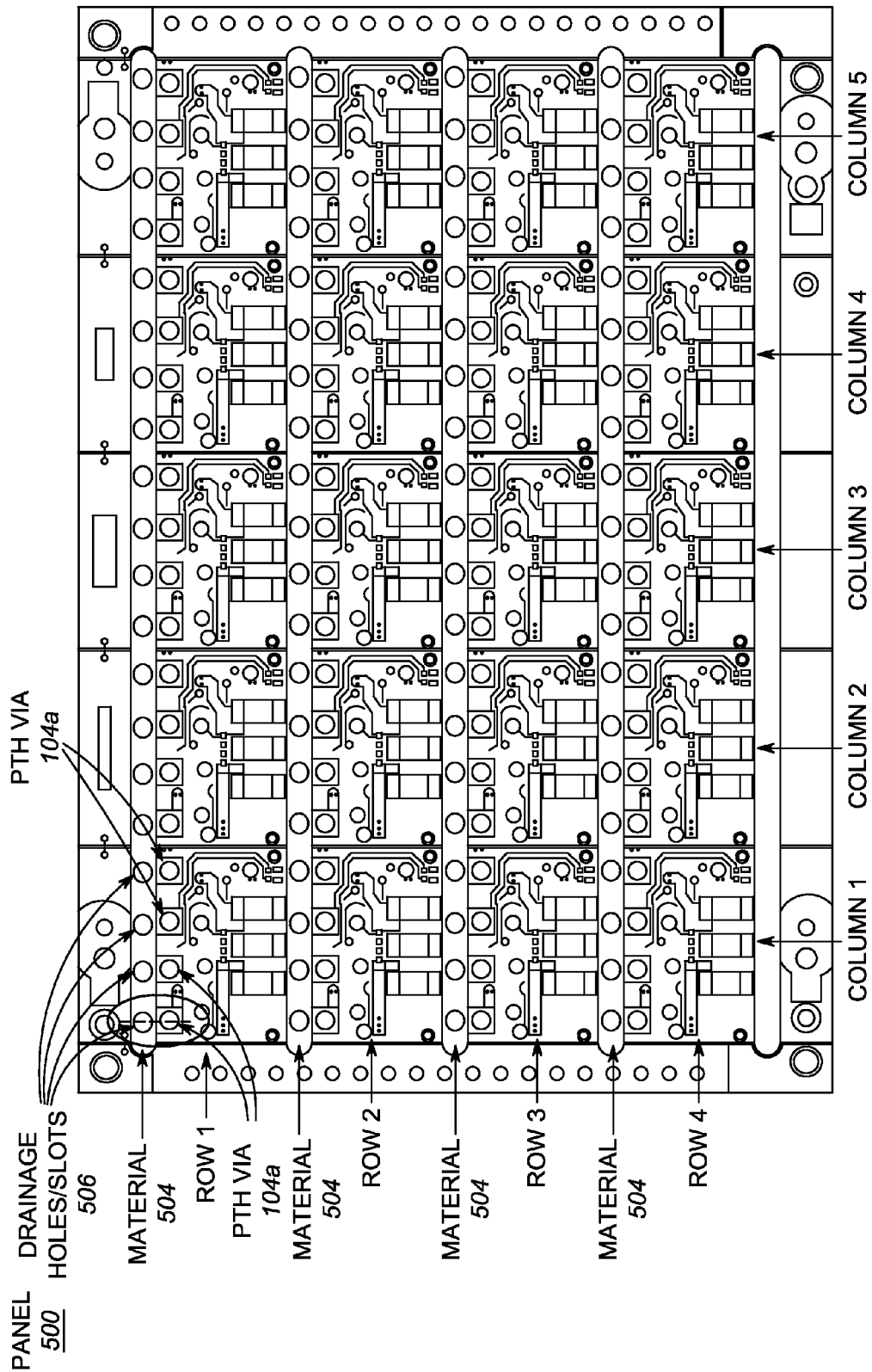

FIGS. 5A and 5B show top views of a PCB panel formed in accordance with some embodiments. Panel 500 includes four rows (rows 1-4), each of which includes five columns (columns 1-5) with PCBs 100. For ease of illustration, only the PTH via on the upper left PCB 100 is labeled. A see-through grill 502 (i.e., see-through grills 502*a*-502*e* shown in FIG. 5A) is provided between each of rows 1-4. During construction of panel 500, each section shown as see-through grill 502 includes a material 504 (as shown in FIG. 5B) with drainage holes/slots 506 that are adjacent to each PTH via (for example, PTH via 104*a*) on each PCB 100. The drainage holes/slots 506 in each section is provided in order for the plating liquid used to plate the conductive material to the PCB 100 to drain/exit out of PCB 100 and form the conductive part of each PCB 100. In other words, the drainage holes/slots 506 adjacent to the PTH via 104 allow the plating material to flow from the PCB to see-through grill 502, which, in a previous process, combined sections of 506 type drainage holes/slots to the respective PCBs (100), to generate: i) a U shaped tunnel from a top view projection; ii) an inverted U shaped tunnel when the PTH via system was located at the reverse side of the PCB 100; and iii) an inverted and flipped "h" drainage passage when consider with the embodiment depicted in FIG. 2B. In order for the free flow of the plating material, drainage holes/slots 506 acts initially as an air flow channel, meaning there would be no impediment of the plating material to air entrapments and plating debris formation otherwise. After the plating process, the sections with drainage holes/slots (i.e., the sections with material 504 and drainage holes/slots 506) are grinded off, leaving see-through grills 502, as shown in FIG. 5A.

Figure 5C:
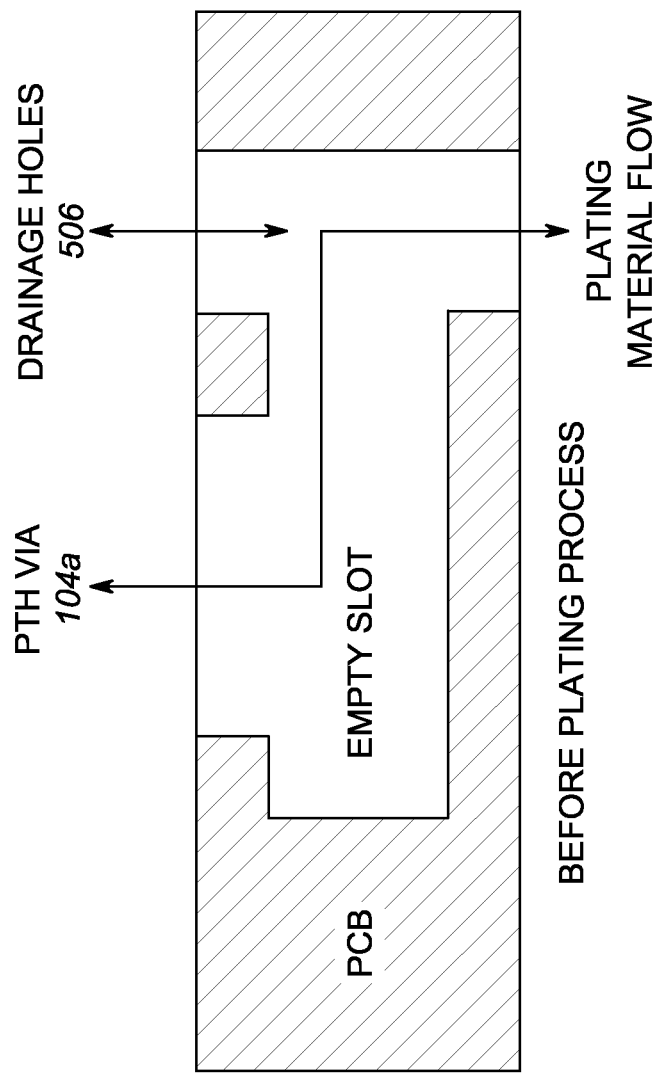
FIG. 5C is a block diagram of the PCB before a plating process in accordance with some embodiments.

FIG. 5C is a block diagram of the PCB before the plating process in accordance with some embodiments. Plating material entered through PTH via 104 flows through drainage hole 506 as shown by the arrows.

Figure 6:
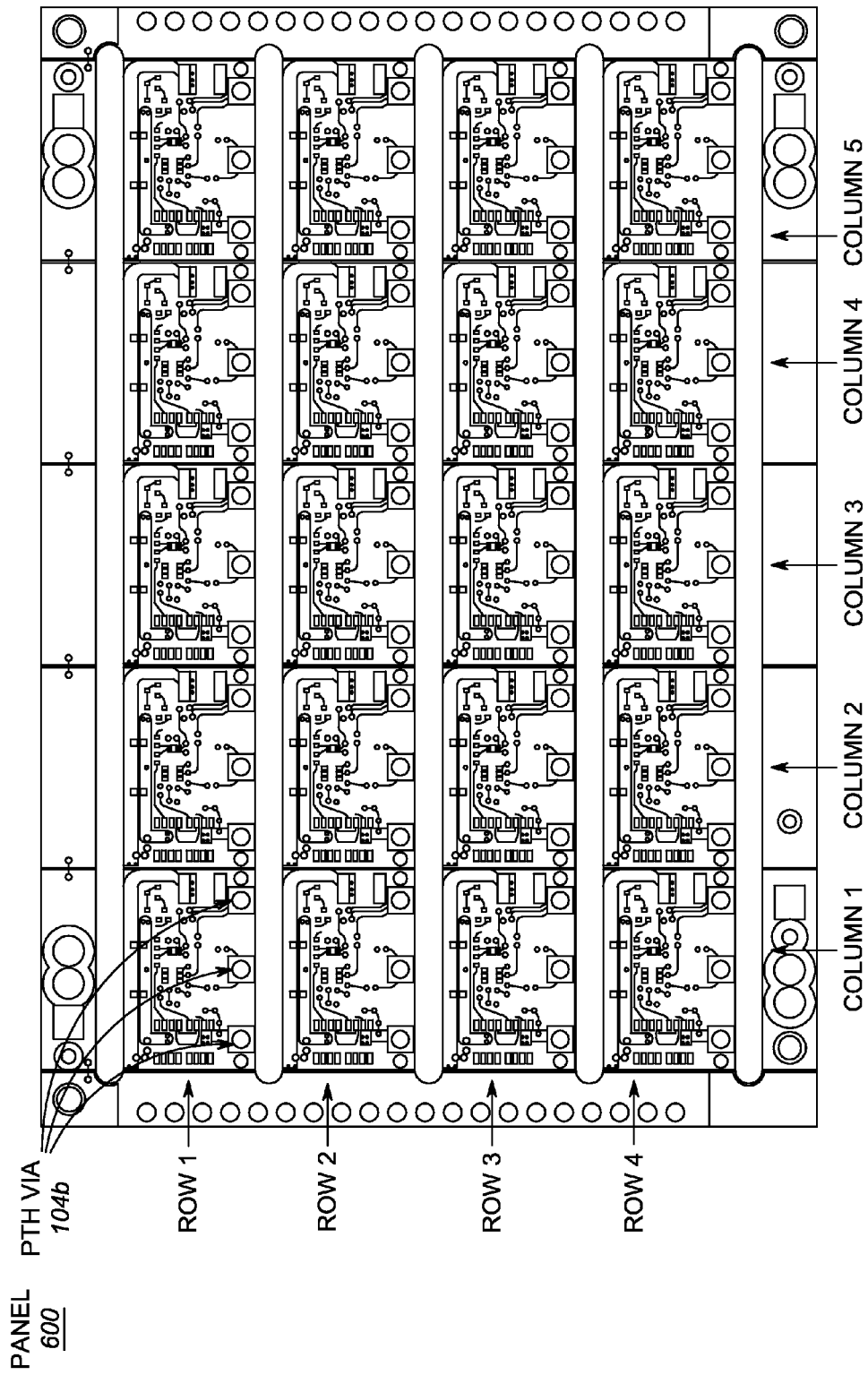
FIG. 6 is a bottom view of a PCB panel formed in accordance with some embodiments.

FIG. 6 is a bottom view of a PCB panel formed in accordance with some embodiments. Panel 600 is the opposite side of the panel shown in FIG. 5A and includes four rows (rows 1-4), each of which includes five columns (columns 1-5) with PCBs 100. Similar to FIGS. 5A and 5B, for ease of illustration, only the components on the upper left PCB 100 are labeled.

Figure 7:
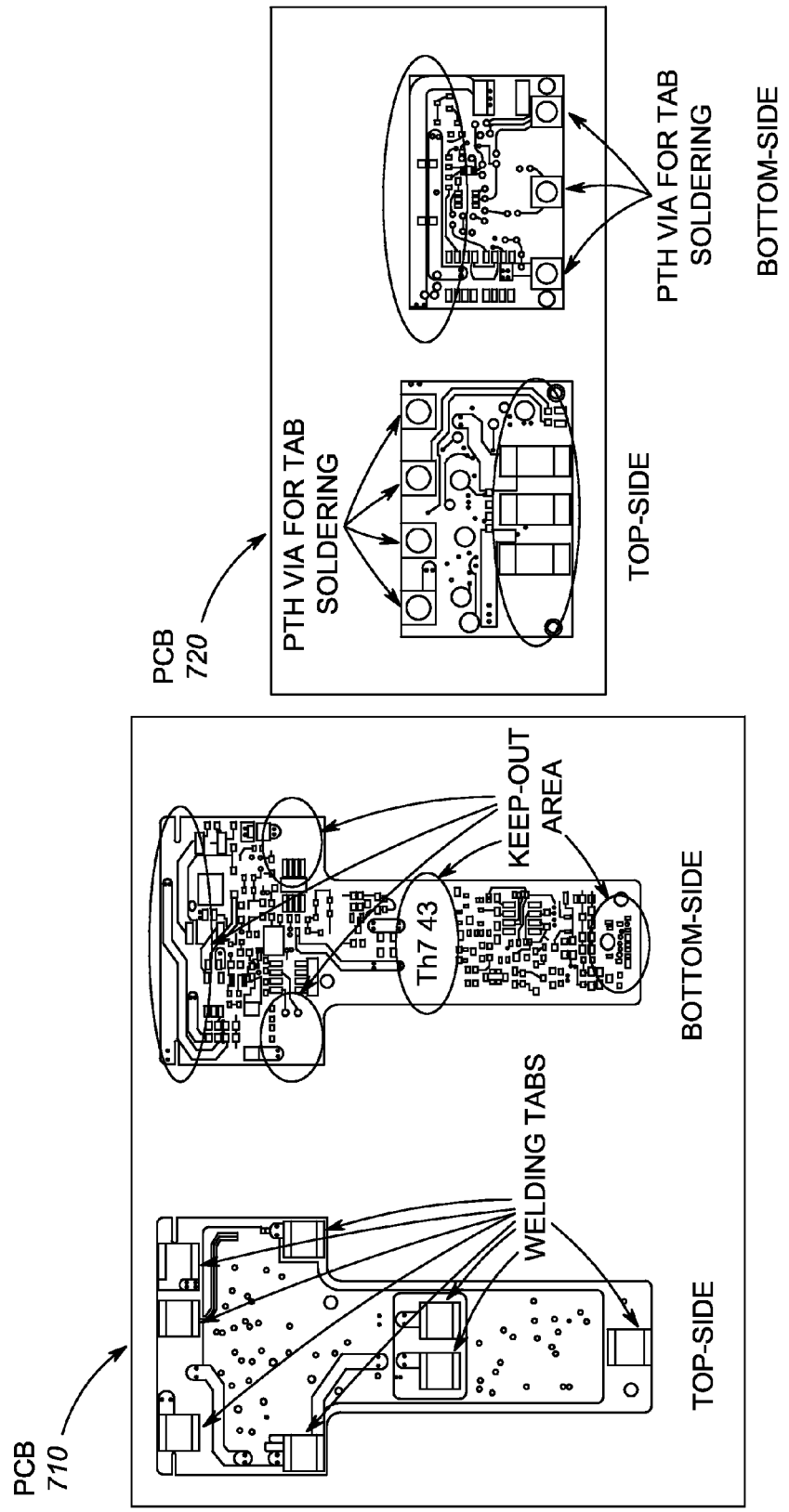
FIG. 7 shows a comparison of a past PCB including spot welding joints and a PCB formed in accordance with the various embodiments.

FIG. 7 shows a comparison a past PCB including spot welding joints and a PCB formed in accordance with the various embodiments. The top side of PCB 710 shows sections of the PCB where tabs may be spot welded. The bottom side of PCB 710 shows keep-out area. PCB 720, on the other hand, which is smaller in size than PCB 710 shows PTH via for tab soldering on the top and bottom sides of PCB 720. In PCB 720, no keep-out areas are required underneath the soldering pads. Hence, the space on the opposite side of the soldering pads may be used for product placement, allowing the size of PCB 720 to be reduced. PCB 720 also eliminates welding tabs, thereby reducing cost. The size of the soldering pads in PCB 720 is smaller than the size of the welding tabs in PCB 710 by, for example, half, also allowing the size of PCB 720 to be reduced. In PCB 720, there is no pre-plating of tin and the interconnections have very low impedances.

The following table shows the results from a solder strength test performed on a PCB formed in accordance with some embodiments.

| Sample # | 1<br>Nickel tab to PCB |
|---|---|
| minimum pull spec/lbf | 8.00 |
| 1 | 36.76 |
| 2 | 30.16 |
| 3 | 41.07 |
| 4 | 25.93 |
| 5 | 31.32 |
| 6 | 34.81 |
| 7 | 36.34 |
| 8 | 29.34 |
| 9 | 29.26 |
| 10 | 29.54 |
| 11 | 38.59 |
| 12 | 24.39 |
| 13 | 26.30 |

-continued

| Sample # | 1<br>Nickel tab to PCB |
|---|---|
| 14 | 46.76 |
| 15 | 36.53 |
| 16 | 40.73 |
| 17 | 54.63 |
| 18 | 44.55 |
| 19 | 30.31 |
| 20 | 40.43 |
| 21 | 57.51 |
| 22 | 38.70 |
| 23 | 50.92 |
| 24 | 54.82 |
| 25 | 37.21 |
| 26 | 29.64 |
| 27 | 26.56 |
| 28 | 31.06 |
| 29 | 32.63 |
| 30 | 31.92 |
| min | 24.39 |
| max | 57.51 |

The pull test requirement for each solder joint was greater than or equal to 8 lbs. 30 samples were tested and all 30 samples passed the pull test minimum of 24 lb (until the tab itself broke). During the pull test, the solder joint remained intact and the pull test stopped when the tab was broken.

In an embodiment, a two layer PCB includes an insertion slot that eliminates the need for welding tabs, welding points and associated processes, and spacers for securing spot welding. A board size, for example, of 44×34 mm is provided by a regular mechanical board outline. The board size includes sufficient space to fit 80 components of, for example, a battery PCB assembly and facilitates the concept of using a common board. Other sizes and other numbers of components can benefit from PCBs formed in accordance with the various embodiments. The PCB has been miniaturized while still being able to accommodate a large number of product parts. Further, superior performances pertaining to reliability, robustness, fault protection mechanisms, efficient DFA, EMC, low and high frequency noise rejection/suppression are accomplished at PCB sub assembly level, product level and product systems level. Also, with the process of inserting a conducted element of the aforementioned types and then performing manual or robotic soldering, the plated PTH via with the interconnecting conductive soldering channel becomes a containment apparatus in itself to limit the solder melted in the PTH via to its contained volume, thereby eliminating solder balls, debris, uncontrolled solder lumps. This also limits and controls the soldering process and a solder melt volume within the PTH diametrical "fence" or physical legend, thereby eliminating inadvertent soldering processes that would otherwise contribute to faults, for example, short circuits, cold solder joints which propagate to high impedances, intermittent and open circuits, and mechanical sub assembly tolerance stack up interferences.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:
1. A printed circuit board, comprising:
at least one plated-through hole via drilled into at least one of a first layer on a first side of the printed circuit board and a second layer on a second side of the printed circuit board;
a core section laminated between the first layer and the second layer, wherein a length of the core section is shorter than a length of the first layer and a length of the second layer; and
an open slot configured to house a connection tab of an electronic product connected to the printed circuit board, wherein the open slot is formed adjacent to the core section and between sections of the first layer and the second layer that are longer than the core section.

2. The printed circuit board of claim 1, wherein each of the first layer and the second layer includes a conductive material plated to the printed circuit board.

3. The printed circuit board of claim 2, wherein the conductive material is copper.

4. The printed circuit board of claim 1, wherein a diameter of the at least one plated-through hole via is 3 mm.

5. The printed circuit board of claim 1, further comprising a solder mask applied to a top of the first layer and a solder mask applied to a bottom of the second layer.

6. The printed circuit board of claim 1, wherein the connection tab is inserted in the open slot and melted solder is applied to the open slot through the at least one plated-through hole via to affix the connection tab to the printed circuit board.

7. The printed circuit board of claim 1, wherein a diameter of the open slot is 6 mm.

8. The printed circuit board of claim 1, wherein the connection tab is one of a metal tab, a contact, a ground finger, Electromagnetic Interference (EMI) absorbers or structures, or another interconnect element.

9. The printed circuit board of claim 1, wherein the core section limits the connection tab insertion depth, provides guidance and prevents misalignments of a connection tab assembly.

10. The printed circuit board of claim 1, wherein the core section includes a prepeg material.

11. The printed circuit board of claim 1, wherein each of the first layer and the second layer is a composite of a pre-laminated two layer board.

12. The printed circuit board of claim 1, wherein the printed circuit board is configured in a radio battery product.

13. A panel, comprising:
   at least one row of printed circuit boards; and
   a drainage section,
   wherein each printed circuit board comprises:
      at least one plated-through hole via drilled into at least one of a first layer on a first side of the printed circuit board and a second layer on a second side of the printed circuit board;
      a core section laminated between the first layer and the second layer, wherein a length of the core section is shorter than a length of the first layer and a length of the second layer; and
      an open slot configured to house a connection tab of an electronic product connected to the printed circuit board, wherein the open slot is formed adjacent to the core section and between sections of the first layer and the second layer that are longer than the core section, and
   wherein the drainage section includes drainage holes adjacent to each plated-through hole via.

14. The panel of claim 13, wherein plating liquid used to plate a conductive material to the printed circuit board and to plate the at least one plated-through hole via and an adjoining input path exits through the drainage holes, thereby enabling continuous negligible impedance conductivity of an entire passage from an input orifice to an output orifice.

15. The panel of claim 13, wherein the drainage section is removable.

* * * * *